US 11,502,143 B2

(12) United States Patent
Fan et al.

(10) Patent No.: US 11,502,143 B2
(45) Date of Patent: Nov. 15, 2022

(54) METHOD OF FORMIMG A DISPLAY DEVICE COMPRISING A REFLECTIVE CUP-SHAPED PIXEL DEFINING

(71) Applicant: BOE TECHNOLOGY GROUP CO., LTD., Beijing (CN)

(72) Inventors: Xing Fan, Beijing (CN); Hao Gao, Beijing (CN); Lujiang Huangfu, Beijing (CN); Yan Fan, Beijing (CN); Xiangmin Wen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/639,039

(22) PCT Filed: Jul. 12, 2019

(86) PCT No.: PCT/CN2019/095751
§ 371 (c)(1),
(2) Date: Feb. 13, 2020

(87) PCT Pub. No.: WO2020/186666
PCT Pub. Date: Sep. 24, 2020

(65) Prior Publication Data
US 2021/0408177 A1 Dec. 30, 2021

(30) Foreign Application Priority Data

Mar. 15, 2019 (CN) .......................... 201910196764.5

(51) Int. Cl.
H01L 27/32 (2006.01)
H01L 51/52 (2006.01)
H01L 51/56 (2006.01)

(52) U.S. Cl.
CPC ...... H01L 27/3246 (2013.01); H01L 27/3258 (2013.01); H01L 51/5209 (2013.01);
(Continued)

(58) Field of Classification Search
CPC ............. H01L 27/1463; H01L 27/1464; H01L 27/3246; H01L 27/3258; H01L 51/5209;
(Continued)

(56) References Cited

U.S. PATENT DOCUMENTS

2013/0001603 A1* 1/2013 Lim .................... H01L 51/5225
438/34
2018/0090058 A1 3/2018 Chen et al.
(Continued)

FOREIGN PATENT DOCUMENTS

CN 103996693 A 8/2014
CN 104952899 A 9/2015
(Continued)

OTHER PUBLICATIONS

ISA National Property Administration of the People's Republic of China, International Search Report and Written Opinion Issued in Application No. PCT/CN2019/095751, dated Dec. 13, 2019, WIPO, 11 pages.

(Continued)

Primary Examiner — Hoai V Pham
(74) Attorney, Agent, or Firm — McCoy Russell LLP

(57) ABSTRACT

A display back panel may include a substrate, an insulating layer disposed on one side of the substrate and including a plurality of recesses, the plurality of recesses including a bottom surface, a first electrode disposed on a surface of the insulating layer away from the substrate, a pixel defining layer disposed on a surface of the first electrode away from the substrate and including a plurality of openings, a light-emitting layer disposed in the plurality of openings and covering the first electrode, and a second electrode disposed on a surface of the light-emitting layer away from the substrate. Therein, the first electrode may reflect waveguide light laterally propagated by the light-emitting layer, thereby
(Continued)

improving a light-emitting efficiency of the light-emitting layer. Further, the reflected waveguide light may not be absorbed by the second electrode, thereby enhancing an external quantum effect of the light-emitting layer.

20 Claims, 10 Drawing Sheets

(52) U.S. Cl.
CPC ...... *H01L 51/5225* (2013.01); *H01L 51/5271* (2013.01); *H01L 51/56* (2013.01)

(58) Field of Classification Search
CPC ............. H01L 51/5218; H01L 51/5221; H01L 51/5225
USPC .............................................. 257/40; 438/82
See application file for complete search history.

(56) References Cited

U.S. PATENT DOCUMENTS

2018/0331325 A1* 11/2018 Zhang ................. H01L 51/5234
2020/0051966 A1* 2/2020 Lee ..................... H01L 27/3293

FOREIGN PATENT DOCUMENTS

| CN | 106941113 A | 7/2017 |
| CN | 109920826 A | 6/2019 |

OTHER PUBLICATIONS

State Intellectual Property Office of the People's Republic of China, Office Action and Search Report Issued in Application No. 201910196764.5, dated Apr. 24, 2020, 14 pages. (Submitted with Partial Translation).

* cited by examiner

METHOD OF FORMIMG A DISPLAY DEVICE COMPRISING A REFLECTIVE CUP-SHAPED PIXEL DEFINING

CROSS-REFERENCE TO RELATED APPLICATIONS

The present application is a U.S. National Phase of International Application No. PCT/CN2019/095751 entitled DISPLAY BACK PANEL, MANUFACTURING METHODS THEREOF, AND DISPLAY DEVICE and filed on Jul. 12, 2019. International Application No. PCT/CN2019/095751 claims priority to Chinese Patent Application No. 201910196764.5, filed on Mar. 15, 2019. The entire contents of each of the above-listed applications are incorporated herein by reference for all purposes.

TECHNICAL FIELD

The present description relates generally to the field of display technologies, and embodiments of a display back panel, manufacturing methods thereof, and a display device.

BACKGROUND

An organic light-emitting diode (OLED) display device is a self-luminous display device that emits light through an OLED to display an image, and is thinner, lighter, and has improved display characteristics (e.g., a higher contrast ratio) relative to a display device including a liquid crystal display (LCD). As such, OLEDs have garnered attention for incorporation into next-generation display devices.

Since a light-emitting layer of a conventional OLED uses organic electroluminescence (OEL), a refractive index of organic material therein is about 1.8, which is much higher than a refractive index of air (about 1.0003 at standard temperature and pressure). As such, only a small portion (e.g., about 30%) of light generated by the light-emitting layer may be directly emitted from an illuminating surface when an exit angle of the light is less than a total reflection critical angle θ. Most of the light generated by the light-emitting layer is instead reflected at an interface of the OLED and continues to travel within a film thereat in a waveguide mode. Thus, the light that causes the waveguide mode to be transmitted may be lost during transmission or dissipated in an uncontrolled manner at edges of the untreated film (that is, at waveguide terminals), thereby reducing display efficiency.

SUMMARY

As described herein, embodiments of a display back panel, manufacturing methods thereof, and a display device are proposed which may improve upon display efficiency via patterning of an electrode of an OLED structure (e.g., the display back panel) in an OLED device (e.g., the display device). Specifically, a second electrode on a surface of a light-emitting layer in the display back panel may include a pattern thereon, and the patterned second electrode may be confined in a reflective cup-shaped structure. In this way, waveguide light laterally propagated by the light-emitting layer and reflected by a first electrode may freely pass from the display device and not be absorbed by the second electrode, and thus an external quantum effect of the light-emitting layer may be effectively improved.

As such, an embodiment of the present disclosure provides a display back panel having a higher external quantum effect and a higher light-emitting efficiency as compared to conventional OLED structures. In one example, the display back panel comprises a substrate, an insulating layer disposed on one side of the substrate, the insulating layer comprising a plurality of recesses, the plurality of recesses comprising a bottom surface and an inclined portion, a first electrode disposed on a surface of the insulating layer facing away from the substrate, a pixel defining layer disposed on a surface of the first electrode facing away from the substrate, the pixel defining layer comprising a plurality of openings, where an orthographic projection of the plurality of openings on the substrate overlaps an orthographic projection of the bottom surface of the plurality of recesses on the substrate, a light-emitting layer disposed in the plurality of openings and covering at least a portion of the first electrode, and a second electrode disposed on a surface of the light-emitting layer facing away from the substrate, where an orthographic projection of the second electrode on the first electrode overlaps an orthographic projection of the plurality of openings on the first electrode.

In the display back panel, the first electrode may reflect waveguide light laterally propagated by the light-emitting layer, thereby improving a light-emitting efficiency of the light-emitting layer. Further, the reflected waveguide light does not need to pass through the second electrode, which is confined in a reflective cup-shaped structure, thereby enhancing an external quantum effect of the light-emitting layer.

Further, an embodiment of the present disclosure provides a method of manufacturing a display back panel. In one example, the method comprises sequentially forming an insulating layer, a first electrode, and a pixel defining layer on one side of a substrate, where the insulating layer has a plurality of recesses, the plurality of recesses comprising a bottom surface and an inclined portion, the pixel defining layer comprises a plurality of openings, and an orthographic projection of the plurality of openings on the substrate overlaps an orthographic projection of the bottom surface of the plurality of recesses on the substrate, forming a photoresist layer on a surface of the pixel defining layer facing away from the substrate, where an orthographic projection of a hollow portion of a pattern of the photoresist layer on the first electrode overlaps an orthographic projection of the plurality of openings on the first electrode, and forming a light-emitting layer and a second electrode, including forming a light-emitting material layer on a surface of the photoresist layer and the first electrode, forming the light-emitting layer by peeling off the photoresist layer, and forming the second electrode on a surface of the light-emitting layer facing away from the substrate, where an orthographic projection of the second electrode on the first electrode overlaps an orthographic projection of the plurality of openings on the first electrode.

Using the method of manufacturing the display back panel, on the pixel defining layer having reflective cup-shaped structures between pixels of the substrate, the photoresist layer having an openwork pattern (e.g., a pattern with a hollow portion) is formed. After deposition of the light-emitting layer, the photoresist layer may be peeled off, and openings may be naturally formed between the pixels. As such, waveguide light reflected by the reflective cup-shaped structures may freely pass from the display back panel, thereby improving the external quantum effect of the light-emitting layer.

Further, an embodiment of the present disclosure provides a display device. In one example, the display device comprises the display back panel described above and a control circuit board.

The display device may have a higher light-emitting efficiency and a higher external quantum effect, corresponding to a lower energy consumption and an improved display effect.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure. Additionally, the summary above does not constitute an admission that the technical problems and challenges discussed were known to anyone other than the inventors.

DETAILED DESCRIPTION

The following description relates to a display back panel, manufacturing methods thereof, and a display device including the display back panel. The specific embodiments of the present invention will be described in detail below with reference to the accompanying figures. It is to be understood that the specific embodiments described herein are merely illustrative and not restrictive.

Figure 1:
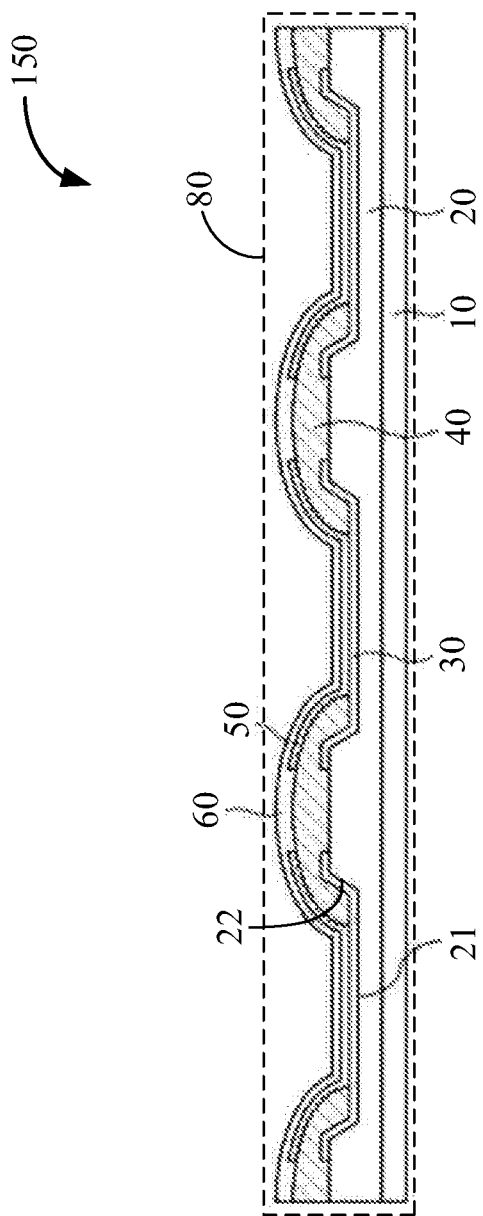
FIG. 1 shows a cross-sectional view of a conventional organic light-emitting diode structure.

Referring now to FIG. 1, a schematic diagram 150 of a conventional organic light-emitting diode (OLED) structure 80 is depicted. The conventional OLED structure 80 may be a reflective cup-shaped structure included in an OLED device. The conventional OLED structure 80 may include a substrate 10 and an insulating layer 20 disposed thereon. The insulating layer 20 may have a plurality of recesses, each of which may include a bottom surface 21 and an inclined portion 22. A first electrode 30 may be disposed in the plurality of recesses. A pixel defining layer 40 may be disposed on at least a portion of each of the insulating layer 20 and the first electrode 30. Further, a light-emitting layer 50 may be disposed on at least a portion of each of the first electrode 30 and the pixel defining layer 40. A second electrode 60 may be continuously disposed on at least a portion of each of the pixel defining layer 40 and the light-emitting layer 50.

Currently, considering that each sub-pixel of the conventional OLED structure 80 is a separate light-emitting film layer (or region), a pixel structure may be utilized to extract waveguide light from an edge of the corresponding light-emitting film layer (or region), or waveguide light passed into the pixel defining layer 40. For example, the waveguide light entering a given pixel structure from an edge of a corresponding top emitting device (light-emitting region) is reflected by the pixel defining layer 40, such that the light is turned away from a waveguide mode and thereby increasing an external quantum efficiency of the conventional OLED structure 80. However, a cathode therein (e.g., the second electrode 60) uses a full-surface structure or absorb a part of reflected waveguide light, thereby concomitantly reducing display efficiency.

Specifically, in the conventional OLED structure 80, after the waveguide light emitted from a light-emitting layer 50 is reflected by a first electrode 30 at an inclined portion 22 of an insulating layer 20, the light then must pass through the light-emitting layer 50 and a second electrode 60. In this way, since the second electrode 60 thus absorbs at least a part of the waveguide light, the display efficiency is lowered.

Figure 2:
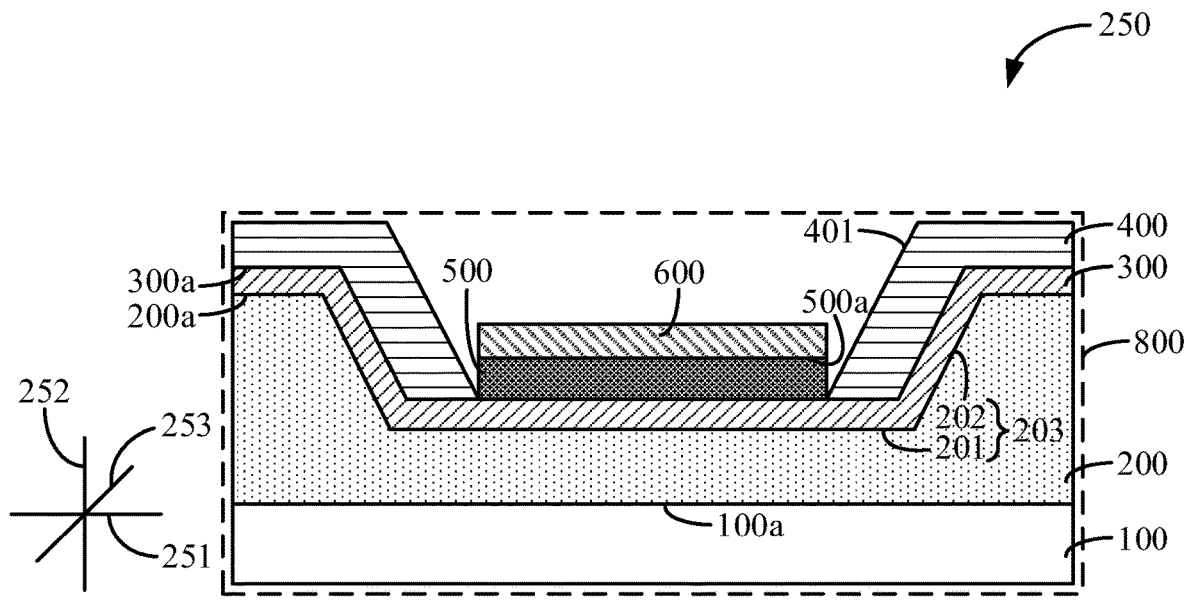
FIG. 2 shows a cross-sectional view of a display back panel according to an embodiment of the present disclosure.

As such, and as will be described below with reference to FIGS. 2, 3, 11, and 12, a display back panel is provided by an embodiment of the present disclosure. Referring now to FIG. 2, a cross-sectional view 250 depicts a display back panel 800. The display back panel 800 includes a substrate 100, an insulating layer 200, a first electrode 300, a pixel defining layer 400, a light-emitting layer 500, and a second electrode 600. The insulating layer 200 is disposed on one side 100a of the substrate 100. Further, the insulating layer 200 includes a plurality of recesses 203, where each of the plurality of recesses 203 respectively includes a bottom surface 201 and an inclined portion 202. The first electrode 300 is disposed on a surface 200a of the insulating layer 200 facing away from the substrate 100. The pixel defining layer 400 is disposed on a surface 300a of the first electrode 300 facing away from the substrate 100. Further, the pixel defining layer 400 includes a plurality of openings 401. An orthographic projection of each of the plurality of openings 401 on the substrate 100 respectively overlaps an orthographic projection of the bottom surface 201 of each of the plurality of recesses 203 on the substrate 100. The light-emitting layer 500 is disposed in the plurality of openings 401 and covers at least a portion of the first electrode 300. The second electrode 600 is disposed on a surface 500a of the light-emitting layer 500 facing away from the substrate 100. An orthographic projection of the second electrode 600 on the first electrode 300 overlaps an orthographic projection of the plurality of openings 401 on the first electrode 300. Mutually perpendicular axes 251, 252, and 253 define a three-dimensional space for the cross-sectional view 250, where the axis 251 and the axis 252 define a plane of FIG. 2 and the axis 253 is normal to the plane of FIG. 2. It will be appreciated that FIGS. 3, 5-7, 10, and 11 (described in more detail below) are depicted in the same plane as FIG. 2. It will further be appreciated that FIG. 12 (described in more detail below) is depicted in a plane which is perpendicular to the plane of FIG. 2.

In one example, "orthographic projection" includes a projection of three spatial dimensions into two spatial dimensions. For example, the cross-sectional view 250 is an orthographic projection of a three-dimensional space defined by the axes 251, 252, and 253 to a two-dimensional space, or plane, defined by the axes 251 and 252. Further, "overlap" may refer to one element partially or completely obscuring another in a given orthographic projection. Further, "completely cover" may refer to one element completely obscuring another in a given orthographic projection.

Figure 3:
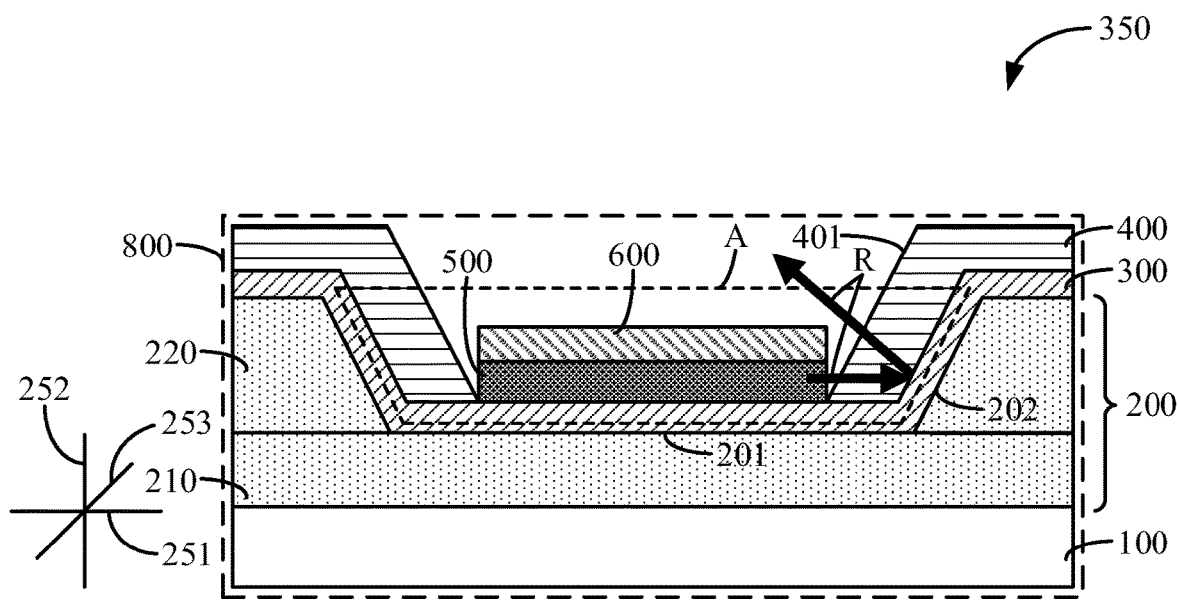
FIG. 3 shows a schematic diagram of a light-emitting effect of a reflective cup-shaped structure of the display back panel according to an embodiment of the present disclosure.

Referring now to FIG. 3, a schematic diagram 350 depicts a light-emitting effect of a reflective cup-shaped structure A of the display back panel 800. In some examples, the second electrode 600 disposed on the surface 500a of the light-emitting layer 500 is patterned so as to be confined within each of the plurality of openings 401 respectively corresponding to the reflective cup-shaped structure A. In this way, a waveguide light R that is laterally propagated (e.g., parallel to the axis 251) by the light-emitting layer 500 and reflected by the first electrode 300 may freely pass from the display back panel 800. As such, the waveguide light R is not absorbed by the second electrode 600 such that an external quantum effect of an OLED device (such as display device 900, as described below with reference to FIG. 11) including the display back panel 800 can be effectively improved as compared to un-patterned cathodes in conventional OLED devices.

In some examples, the insulating layer 200 may include a first insulating layer, or first insulating sublayer, 210 and a second insulating layer, or second insulating sublayer, 220 in a stacked configuration. Specifically, the second insulating layer 220 including at least one recess may be made thicker by first forming the first insulating layer 210, which may completely cover the substrate 100. Therefrom, an upper surface of the first insulating layer 210 may form the bottom surfaces 201 of the plurality of recesses (e.g., 203), and sides of the second insulating layer 220 may respectively form the inclined portions 202 of the plurality of recesses 203. As such, fabrication of the insulating layer 200 having the plurality of recesses 203 may be simpler and dimensional accuracy may be more controllable relative to a single-step layering process.

In some examples, the first electrode 300 may be an anode and the second electrode 600 may be a cathode. In additional or alternative examples, the first electrode 300 may be composed of a conductive reflective material and the second electrode 600 may be composed of a conductive light transmissive material. As such, patterning the second electrode 600 (e.g., the cathode) so as to confine the second electrode 600 in the plurality of openings 401 may further increase the external quantum effect of a top emission mode of the display back panel 800. In additional or alternative examples, the first electrode 300 (e.g., the anode) may be formed of a magnesium silver (Mg:Ag) alloy and the second electrode 600 (e.g., the cathode) may be formed of a silver/indium tin oxide (Ag/ITO). By using a material having a good reflective effect, such as the Mg:Ag alloy, in the first electrode 300 (e.g., the anode) and a material having a high light transmittance, such as Ag/ITO, in the second electrode 600 (e.g., the cathode), the external quantum effect of the top emission mode of the display back panel 800 may be further improved.

In some examples, the pixel defining layer 400 may be composed of a light transmissive organic material, such as polyethyl methacrylate (PMMA), polyurethane (PU), etc. Thus, absorption of the waveguide light by the pixel defining layer 400 may be effectively reduced, which may further improve the external quantum effect of the top emission mode of the display back panel 800.

In some examples, the orthographic projection of the second electrode 600 on the first electrode 300 may overlap an orthographic projection of the light-emitting layer 500 on the first electrode 300. Specifically, the second electrode 600 and the light-emitting layer 500 may have a same pattern obtained via a one-step patterning process (as described in more detail with reference to FIGS. 9 and 10), which may optimize a process flow and thereby reduce a manufacturing cost.

In some examples, an orthographic projection of the second electrode 600 and the pixel defining layer 400 on the substrate 100 completely covers the substrate 100. Specifically, an edge position of the second electrode 600 (e.g., the cathode) may be as close as possible to an edge position of the pixel defining layer 400, such that a light-emitting rate of the waveguide light emitted laterally between the second electrode 600 and the pixel defining layer 400 may be increased.

Figure 12:
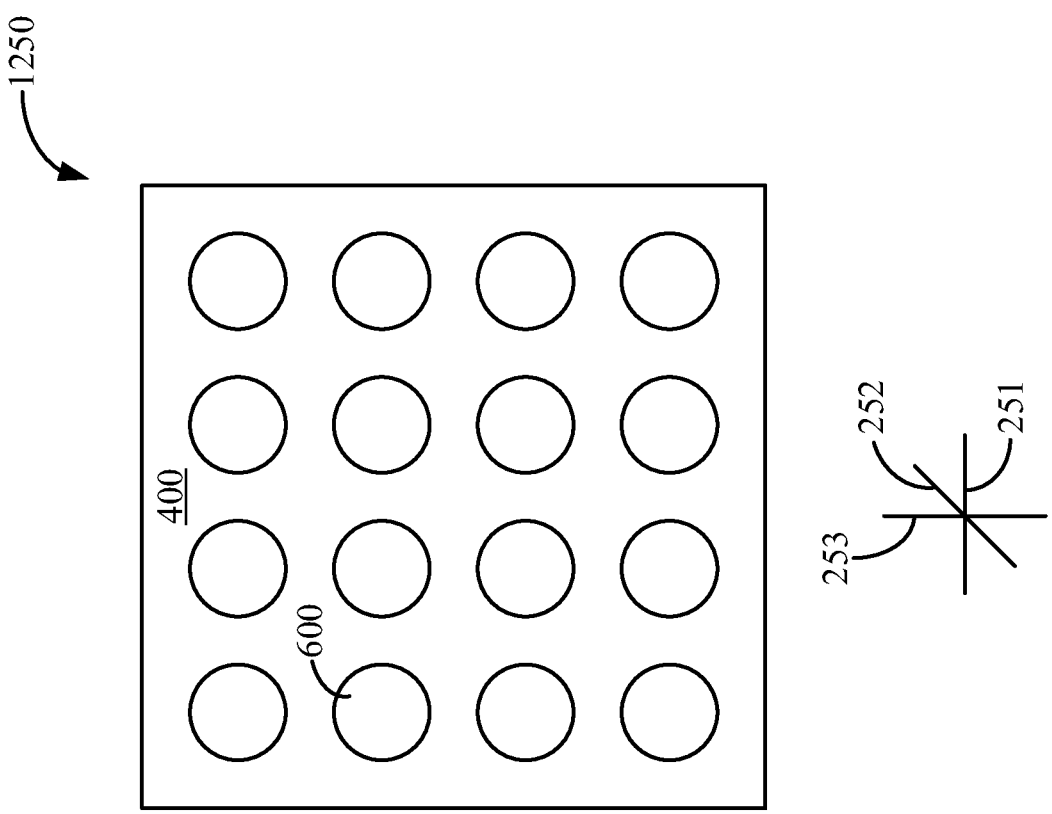
FIG. 12 shows a top view of the pixel defining layer and the second electrode of the display back panel according to an embodiment of the present disclosure.
Figure 11:
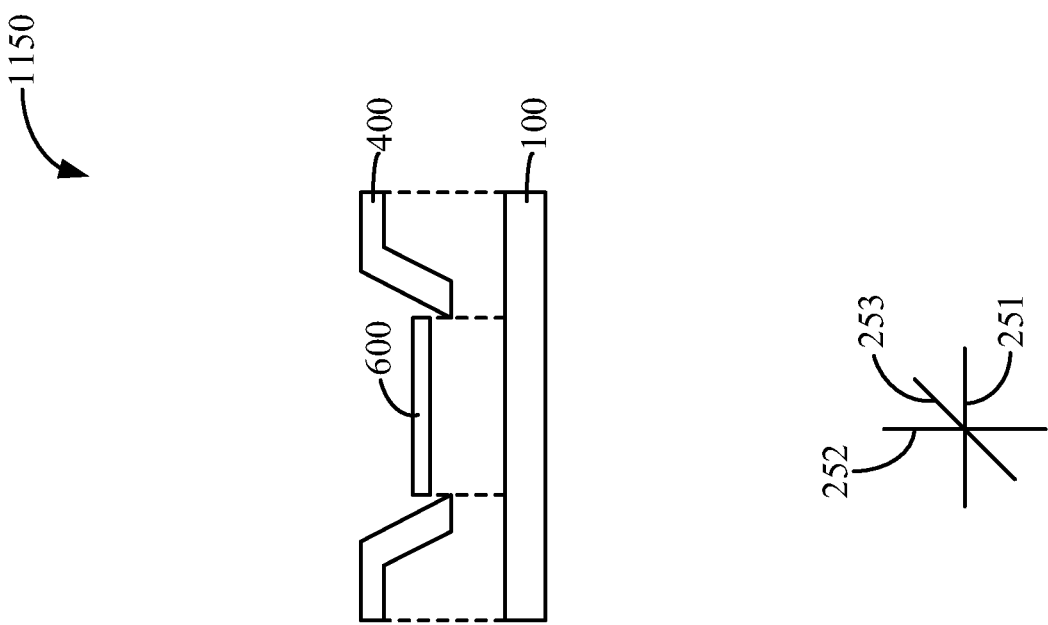
FIG. 11 shows a side view of a substrate, a pixel defining layer, and a second electrode of the display back panel according to an embodiment of the present disclosure.

To provide examples, FIGS. 11 and 12 depict views of elements of the display back panel (e.g., 800). FIG. 11 depicts a side view 1150 depicts the substrate 100, the pixel defining layer 400, and the second electrode 600 of the display back panel 800. A plane of the side view 1150 may be defined by the axes 251 and 252. The axis 253 is orthogonal to the plane of the side view 1150. In the side view 1150, dashed lines are added to demarcate the orthographic projections of each of the pixel defining layer 400 and the second electrode 600 on the substrate 100. As shown, the orthographic projections of the pixel defining layer 400 and the second electrode 600 on the substrate 100 completely cover the substrate 100. FIG. 12 depicts a top view 1250 of the pixel defining layer 400 and the second electrode 600 of the display back panel 800. A plane of the top view 1250 may be defined by the axes 251 and 253. The axis 252 is orthogonal to the plane of the top view 1250. In the top view 1250, the substrate 100 is not visible, as the orthographic projections of the pixel defining layer 400 and the second electrode 600 on the substrate 100 (e.g., along the axis 253) completely cover the substrate 100.

In summary, an embodiment of the present disclosure provides the display back panel, where the first electrode included therein may reflect waveguide light laterally propagated from the light-emitting layer, thereby significantly improving a light-emitting efficiency of the light-emitting layer. Moreover, the reflected waveguide light may not pass through the second electrode confined in the opening of the reflective cup-shaped structure, thereby further enhancing the external quantum effect of the OLED device (e.g., display device) including the display back panel.

Further, and as will be described below with reference to FIGS. 4-10 and 13, methods of manufacturing the display back panel are provided by an embodiment of the present disclosure. It should be understood that elements of the described methods of FIGS. 4-10 may be combined with one another to obtain more specific embodiments.

Figure 4:
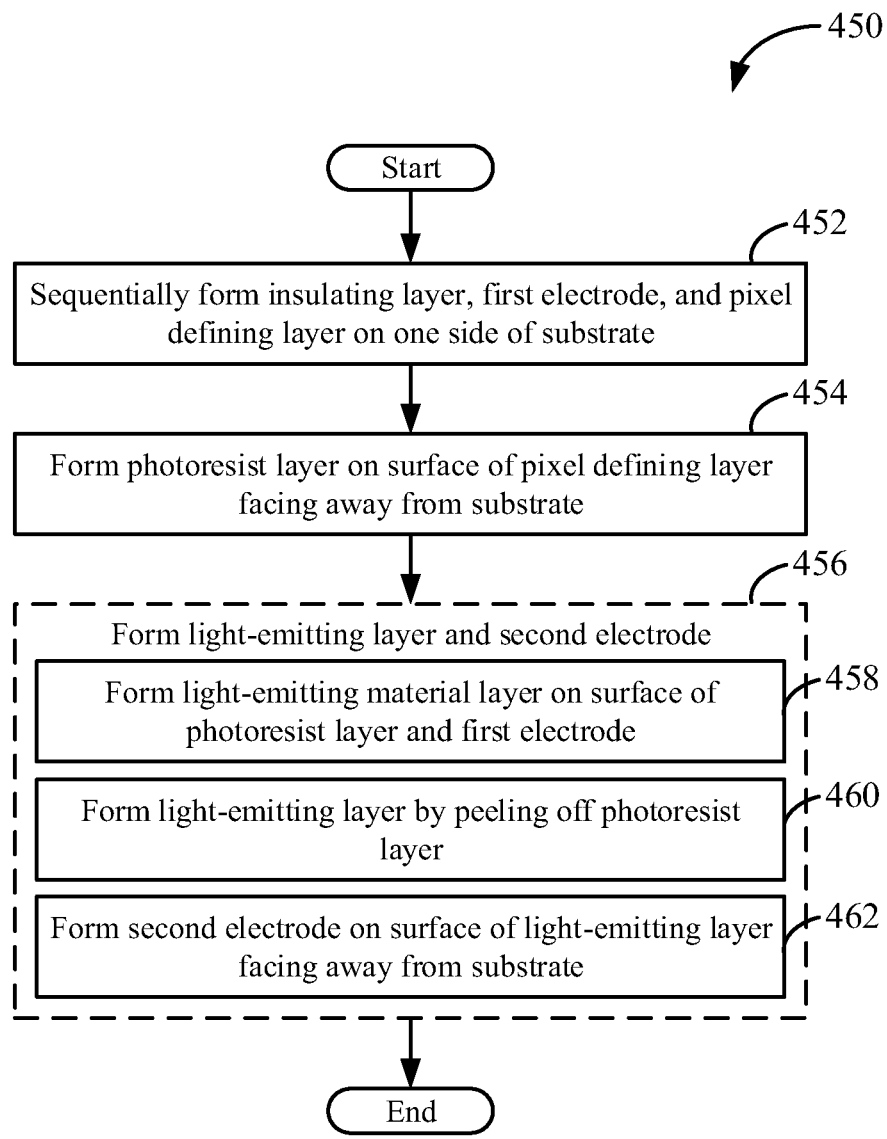
FIG. 4 shows a flow diagram of a first method of manufacturing the display back panel according to an embodiment of the present disclosure.

Referring now to FIG. 4, a flow diagram 450 of a first method of manufacturing the display back panel (e.g., 800) is depicted.

At 452, the insulating layer (e.g., 200), the first electrode (e.g., 300), and the pixel defining layer (e.g., 400) may be sequentially formed on one side (e.g., 100a) of the substrate (e.g., 100).

Figure 5:
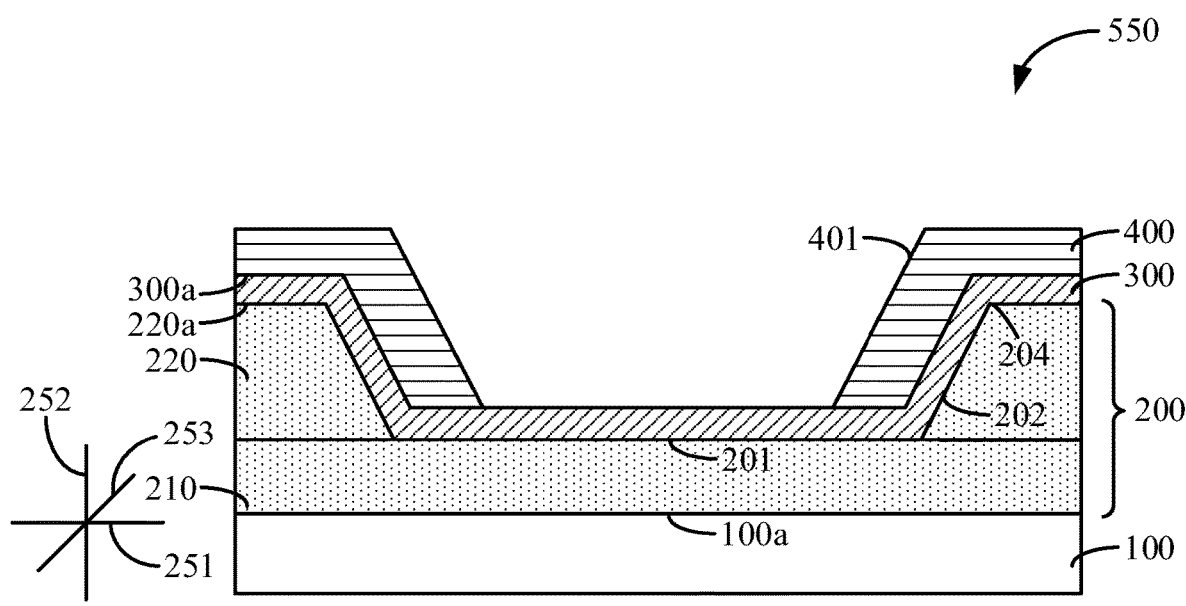
FIG. 5 shows a cross-sectional view of a product of a first example step of a manufacturing process of the display back panel according to an embodiment of the present disclosure.

Referring now to FIG. 5, a cross-sectional view 550 of a product of a first example step (e.g., 452) of a manufacturing process of the display back panel (e.g., 800) is depicted. In the first example step, the insulating layer 200, the first electrode 300, and the pixel defining layer 400 are sequentially formed on one side 100a of the substrate 100. Specifically, the insulating layer 200 having the plurality of recesses (e.g., 203) may be formed first, where each of the plurality of recesses 203 may respectively include the bottom surface 201 and the inclined portion 202. The first electrode 300 may then be formed (e.g., via vapor deposition), where the first electrode 300 is disposed on the bottom surface 201, the inclined portion 202, and at least a portion of a convex portion 204 of the insulating layer 200. The pixel defining layer 400 having the plurality of openings 401 may then be formed (e.g., via vapor deposition) and patterned, where the orthographic projection of each of the plurality of openings 401 on the substrate 100 respectively overlaps the orthographic projection of the bottom surface 201 of each of the plurality of recesses 203 on the substrate 100.

Figure 13:
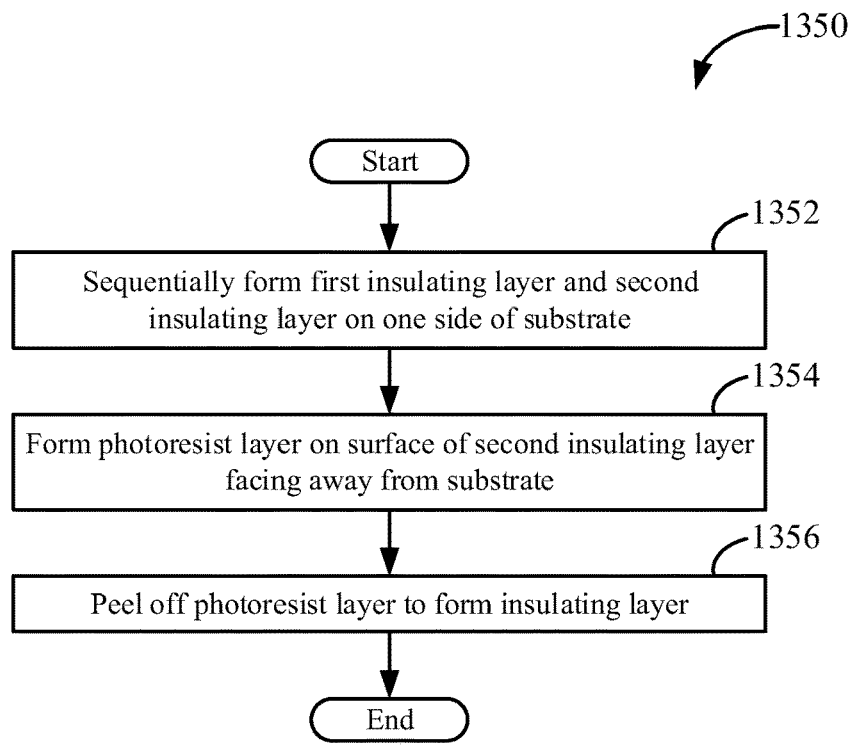
FIG. 13 shows a flow diagram of a method for forming an insulating layer of the display back panel according to an embodiment of the present disclosure.

Referring now to FIG. 13, a flow diagram 1350 of a method for forming the insulating layer (e.g., 200) of the display back panel (e.g., 800) is depicted.

At 1352, the first insulating layer (e.g., 210) and the second insulating layer (e.g., 220) may be sequentially formed on one side (e.g., 100a) of the substrate (e.g., 100).

At 1354, a photoresist layer may be formed on a surface of the second insulation layer (e.g., 220) facing away from the substrate (e.g., 100).

At 1356, the photoresist layer may be peeled off to form the insulating layer (e.g., 200).

Referring now to FIG. 5, in some examples, forming the insulating layer 200 may include sequentially forming the first insulating layer 210 and the second insulating layer 220. Specifically, the first insulating layer 210 and the second insulating layer 220 may be sequentially deposited and then a photoresist layer may be coated, exposed, developed and wet etched on a surface 220a of the second insulating layer 220 facing away from the substrate 100, wherein any portion of the second insulating layer 220 not protected by the photoresist layer may form a recess. When the photoresist layer is removed, the insulating layer 200 having the plurality of the recesses (e.g., 203) may be obtained.

Referring now to FIG. 4, at 454, the photoresist layer may be formed on a surface of the pixel defining layer (e.g., 400) facing away from the substrate (e.g., 100). In some examples, the photoresist layer may be patterned.

Figure 6:
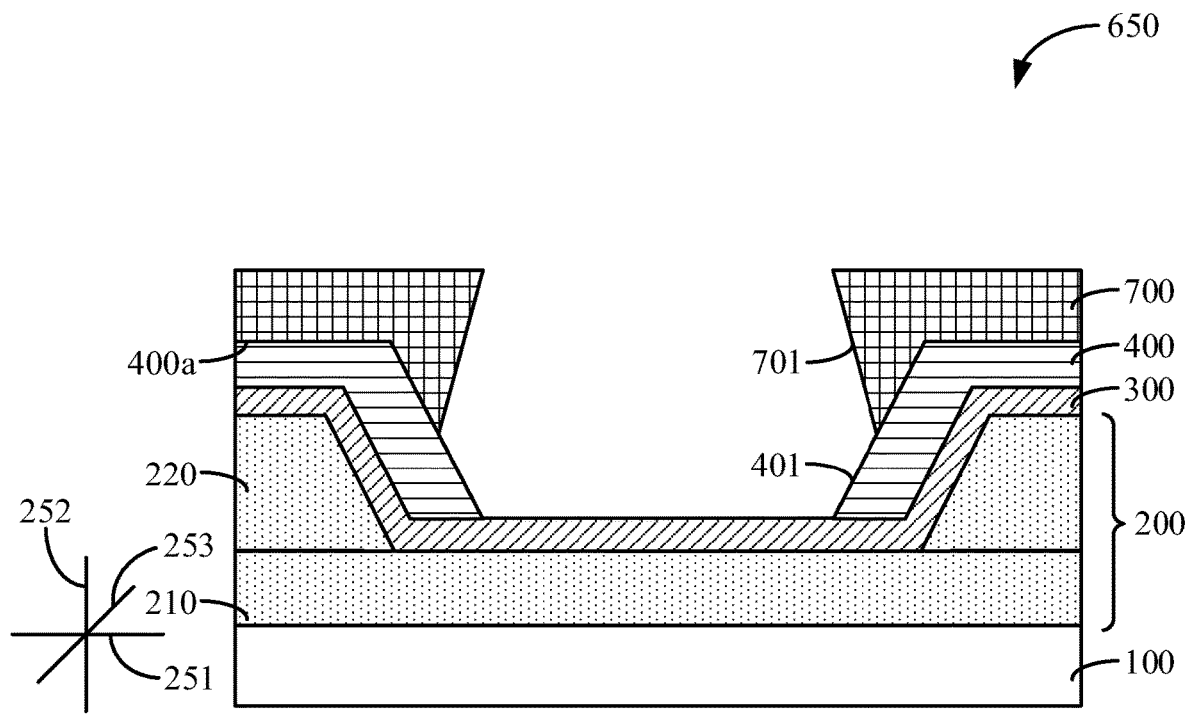
FIG. 6 shows a cross-sectional view of a product of a second example step of the manufacturing process of the display back panel according to an embodiment of the present disclosure.

Referring now to FIG. 6, a cross-sectional view 650 of a product of a second example step (e.g., 454) of the manufacturing process of the display back panel (e.g., 800) is depicted. In the second example step, a photoresist layer 700 may be formed on a surface 400a of the pixel defining layer 400 facing away from the substrate 100, where an orthographic projection of a hollow portion 701 of a pattern of the photoresist layer 700 on the first electrode 300 overlaps an orthographic projection of the plurality of openings 401 on the first electrode 300.

In some examples, the photoresist layer 700 may be formed of a negative photoresist. As such, a longitudinal section (e.g., a cross-section in the plane defined by the axes 251 and 252) of the photoresist layer 700 may be in a shape of an inverted trapezoid. The inverted trapezoid shape may not only facilitates subsequent peeling, but may also facilitate a high precision of a shape and a size of layers (e.g., 500) subsequently formed on the pixel defining layer 400 (e.g., via vapor deposition). Further, compared to a non-inverted trapezoid shaped photoresist layer, a portion of the photoresist layer 700 having the inverted trapezoid shape may be less likely to remain following the peeling. Moreover, the light-emitting layer 500 and the second electrode (e.g., 600) formed in the plurality of openings 401 (e.g., via peeling of the photoresist layer 700 and/or vapor deposition) may not be disconnected from the photoresist layer 700 at any point, thereby making the peeling easier and the patterning of each of the light-emitting layer 500 and the second electrode 600 may be more precise.

In some examples, an orthographic projection of the photoresist layer 700 on the substrate 100 may overlap an orthographic projection of the pixel defining layer 400 on the substrate 100. Specifically, layers (e.g., the light-emitting layer 500) formed by subsequent vapor deposition on the photoresist layer 700 may not cover the pixel defining layer 400, as the photoresist layer 700 may remove any portions of such layers overlapping the pixel defining layer 400. Further, the finally manufactured layers (e.g., the light-emitting layer 500) formed in this way may not absorb reflected waveguide light, thereby ensuring the high external quantum effect of the display back panel (e.g., 800).

Referring now to FIG. 4, at 456, the light-emitting layer (e.g., 500) and the second electrode (e.g., 600) may be formed. Specifically, at 458, a light-emitting material layer may be formed on each of a surface of the photoresist layer (e.g., 700) and the first electrode (e.g., 300). In some examples, the surface of the photoresist layer 700 may face away from the substrate (e.g., 100). Then, at 460, the light-emitting layer 500 may be formed by peeling off the photoresist layer 700.

Figure 7:
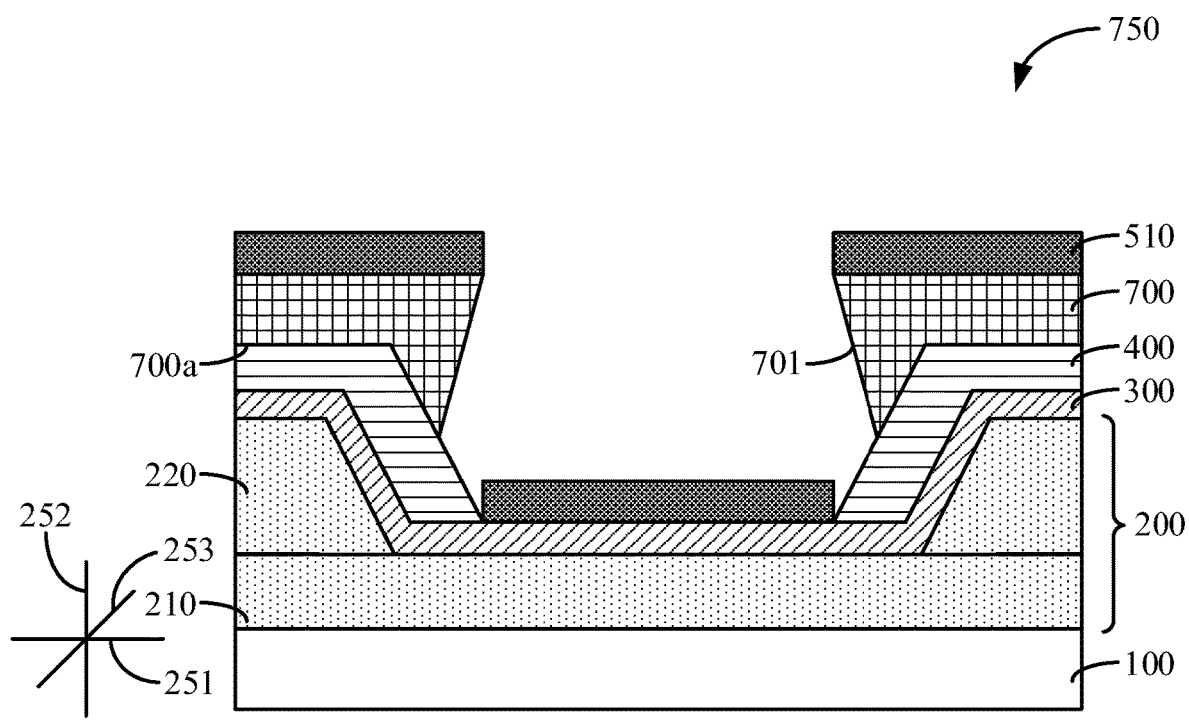
FIG. 7 shows a cross-sectional view of a product of a third example step of the manufacturing process of the display back panel according to an embodiment of the present disclosure.

Referring now to FIG. 7, a cross-sectional view 750 of a product of a third example step (e.g., 458) of the manufacturing process of the display back panel (e.g., 800) is depicted. In the third example step, a light-emitting material layer 510 may be formed on a surface 700a of the photoresist layer 700 facing away from the substrate 100 and at least a portion of the first electrode 300. The light-emitting layer (e.g., 500) may them be formed by peeling off the photoresist layer 700. It will be appreciated that a specific method of forming the light-emitting layer 500 should not be considered limited by the present disclosure. For example, a similar method to one or more methods described hereinabove, such as vapor deposition, may be selected for a given light-emitting material, details of which are not discussed herein again.

Referring now to FIG. 4, then, at 462, the second electrode (e.g., 600) may be formed on the surface (e.g., 500a) of the light-emitting layer (e.g., 500) facing away from the substrate (e.g., 100). Further, in some examples, the orthographic projection of the second electrode 600 on the first electrode (e.g., 300) may overlap the orthographic projection of the plurality of openings (e.g., 401) on the first electrode 300. It will be appreciated that a specific method of forming the second electrode 600 should not be considered limited by the present disclosure, and that those skilled in the art may design correspondingly according to a given material of the second electrode 600.

Figure 8:
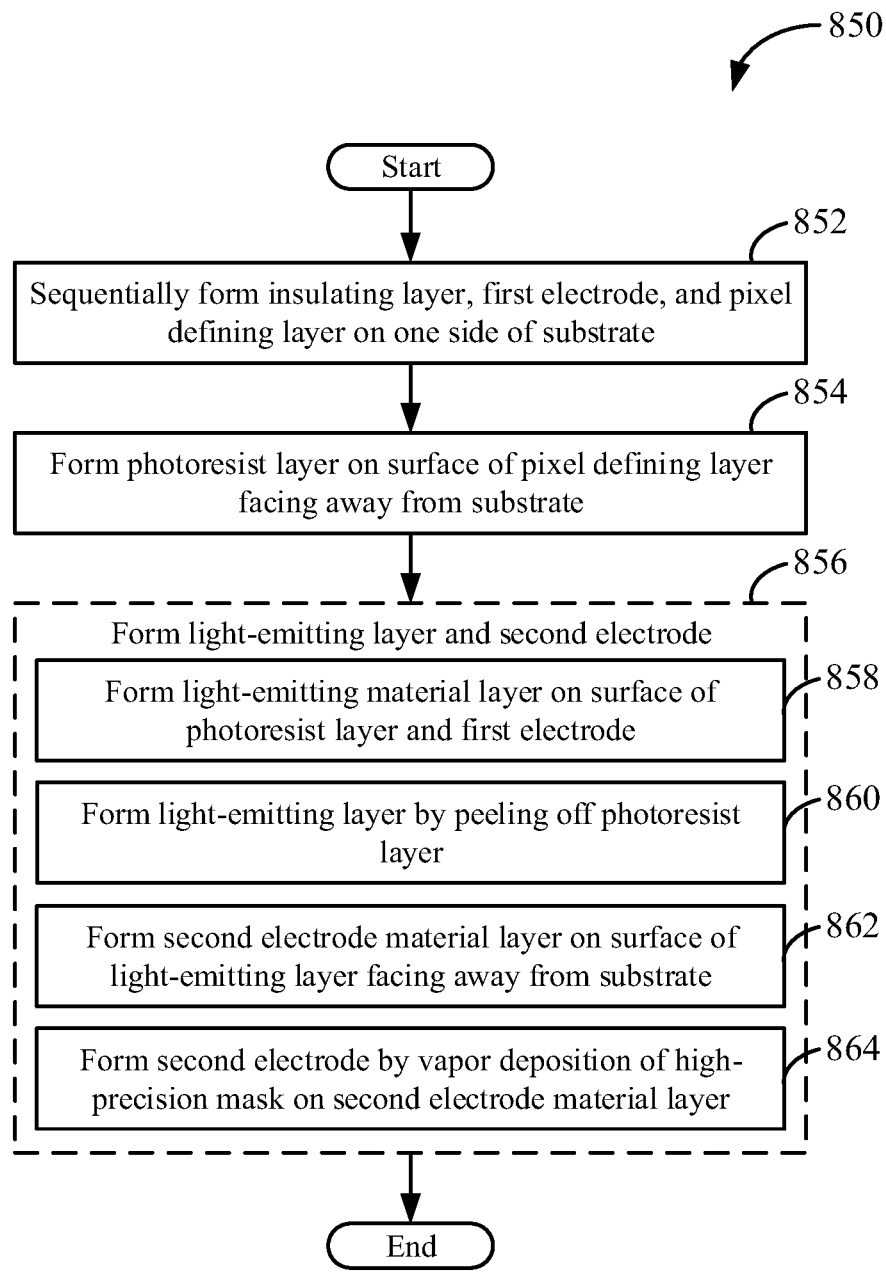
FIG. 8 shows a flow diagram of a second method for manufacturing the display back panel according to an embodiment of the present disclosure.

Referring now to FIG. 8, a flow diagram 850 of a second method of manufacturing the display back panel (e.g., 800) is depicted.

At 852, the insulating layer (e.g., 200), the first electrode (e.g., 300), and the pixel defining layer (e.g., 400) may be sequentially formed on one side (e.g., 100a) of the substrate (e.g., 100).

At 854, the photoresist layer may be formed on a surface of the pixel defining layer (e.g., 400) facing away from the substrate (e.g., 100). In some examples, the photoresist layer may be patterned.

At 856, the light-emitting layer (e.g., 500) and the second electrode (e.g., 600) may be formed. Specifically, at 858, a light-emitting material layer (e.g., 510) may be formed on each of the surface (e.g., 700a) of the photoresist layer (e.g., 700) and the first electrode (e.g., 300). In some examples, the surface 700a of the photoresist layer 700 may face away from the substrate (e.g., 100). Then, at 860, the light-emitting layer 500 may be formed by peeling off the photoresist layer 700. Then, at 862, a second electrode material layer may be formed on the surface (e.g., 500a) of the light-emitting layer 500 facing away from the substrate 100. Then, at 864, the second electrode 600 may be formed by vapor deposition of a high-precision mask on the second electrode material layer. In this way, a pattern of the second electrode 600 may be vapor-deposited on the surface 500a of the light-emitting layer 500 facing away from the substrate 100 by using only a high-precision mask (e.g., a fine metal mask), thus increasing a dimensional accuracy thereof.

Figure 9:
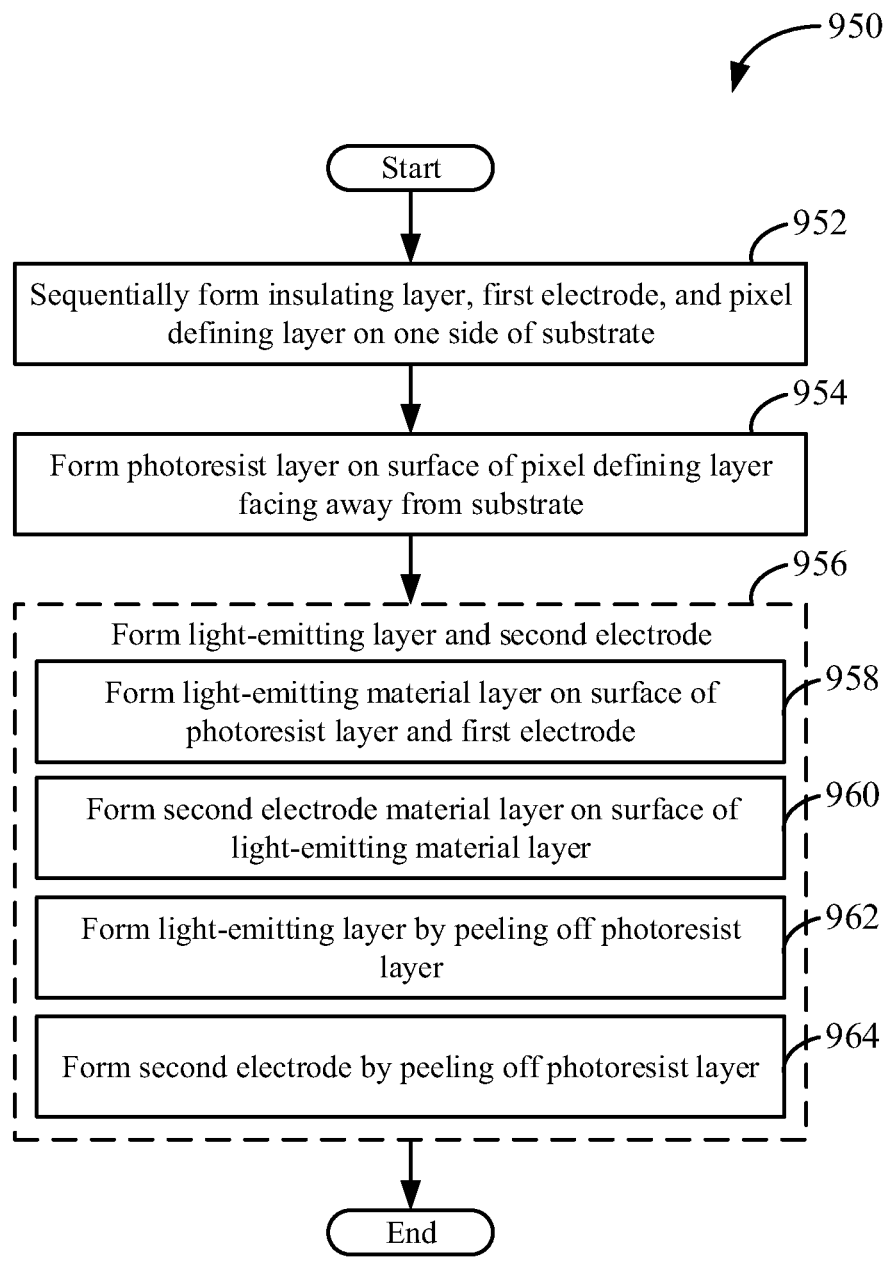
FIG. 9 shows a flow diagram of a third method for manufacturing the display back panel according to an embodiment of the present disclosure.

Referring now to FIG. 9, a flow diagram 950 of a third method of manufacturing the display back panel (e.g., 800) is depicted.

At 952, the insulating layer (e.g., 200), the first electrode (e.g., 300), and the pixel defining layer (e.g., 400) may be sequentially formed on one side (e.g., 100a) of the substrate (e.g., 100).

At 954, the photoresist layer may be formed on a surface of the pixel defining layer (e.g., 400) facing away from the substrate (e.g., 100). In some examples, the photoresist layer may be patterned.

At 956, the light-emitting layer (e.g., 500) and the second electrode (e.g., 600) may be formed. Specifically, at 958, a light-emitting material layer (e.g., 510) may be formed on each of the surface (e.g., 700a) of the photoresist layer (e.g., 700) and the first electrode (e.g., 300). In some examples, the surface 700a of the photoresist layer 700 may face away from the substrate (e.g., 100). Then, at 960, a second electrode material layer may be formed on a surface of the light-emitting material layer 510. In some examples, the surface of the light-emitting material layer 510 may face away from the substrate 100. Then, at 962, the light-emitting layer 500 may be formed by peeling off the photoresist layer 700, and at 964, the second electrode 600 may be formed by peeling off the photoresist layer 700. In this way, the light-emitting layer 500 and the second electrode 600 may be formed simultaneously by peeling off the photoresist layer 700. As such, each of the light-emitting layer 500 and the second electrode 600 may have a same pattern.

Figure 10:
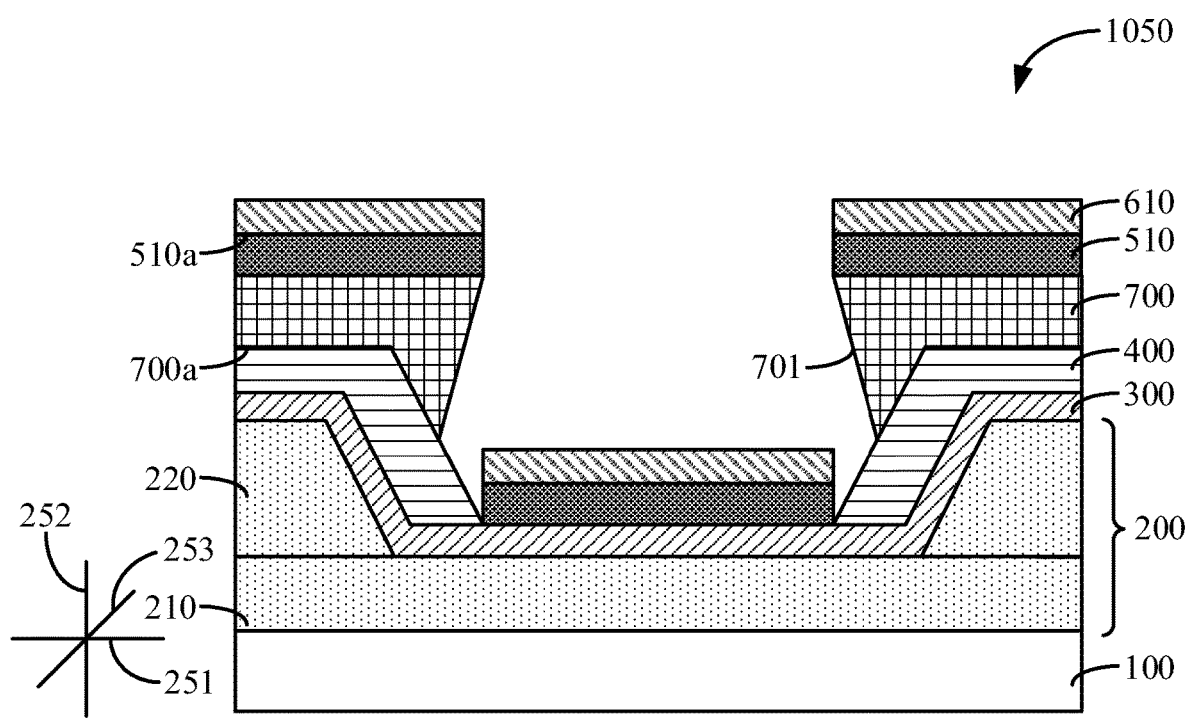
FIG. 10 shows a cross-sectional view of a product of a fourth example step of the manufacturing process of the display back panel according to an embodiment of the present disclosure.

Referring now to FIG. 10, a cross-sectional view 1050 of a product of a fourth example step (e.g., 960) of the manufacturing process of the display back panel (e.g., 800) is depicted. In the fourth example step, the light-emitting material layer 510 and a second electrode material layer 610 may be sequentially formed on the surface 700a of the photoresist layer and at least a portion of the first electrode 300. Specifically, the light-emitting material layer 510 may be formed on the surface 700a of the photoresist layer and at least a portion of the first electrode 300, and then the second electrode material layer 610 may be formed on a surface 510a of the light-emitting material layer 510 facing away from the substrate 100. The light-emitting layer (e.g., 500) and the second electrode (e.g., 600) may then be formed by peeling off the photoresist layer 700, where each of the light-emitting layer 500 and the second electrode 600 may have a same pattern.

In some examples, an orthographic projection of the finally manufactured second electrode (e.g., 600) on the substrate 100 may be smaller than the orthographic projection of the surface 700a of the photoresist layer 700 facing away from the substrate 100. As such, taking into consideration a margin of error of a size of the second electrode 600 formed by an overlay process (e.g., about 1 μm), and adjusting according to an angle of each of the plurality of recesses of the insulating layer 200, an edge position of the second electrode 600 may be as close as possible to edge positions of the plurality of openings 401 defined by a pattern of the pixel defining layer 400. As such, a positional relationship between the pattern of the second electrode 600 and an edge of the pixel defining layer 400 may be effectively controlled, thereby further reducing any dimensional errors arising during manufacturing. Further, it will be appreciated that a specific shape and size of the hollow portion 701 of the pattern of the photoresist layer 700 may be adjusted according to an actual angle of each of the plurality of recesses of the insulating layer 200, or the second insulating layer 220, and, as such, should not be considered limited by the present disclosure.

It will be apparent to those skilled in the art that the specific steps/elements of the manufacturing processes and methods detailed hereinabove with reference to FIGS. 4-10 and 13 may refer to corresponding processes/elements in the device embodiments for convenience and brevity of description, details of which are not described herein again.

In summary, an embodiment of the present disclosure provides the method for manufacturing the display back panel, where the photoresist layer having the pattern including the hollow portion may be formed on the pixel defining layer between pixels of the substrate having respective reflective cup-shaped structures. After subsequent vapor deposition of the light-emitting layer, the photoresist layer may be peeled off, and openings may naturally be formed between the pixels. As such, the waveguide light reflected by the reflective cup-shaped structure may freely pass from an OLED device (e.g., a display device) including the display back panel, thereby improving the external quantum effect of the OLED device.

Figure 14:
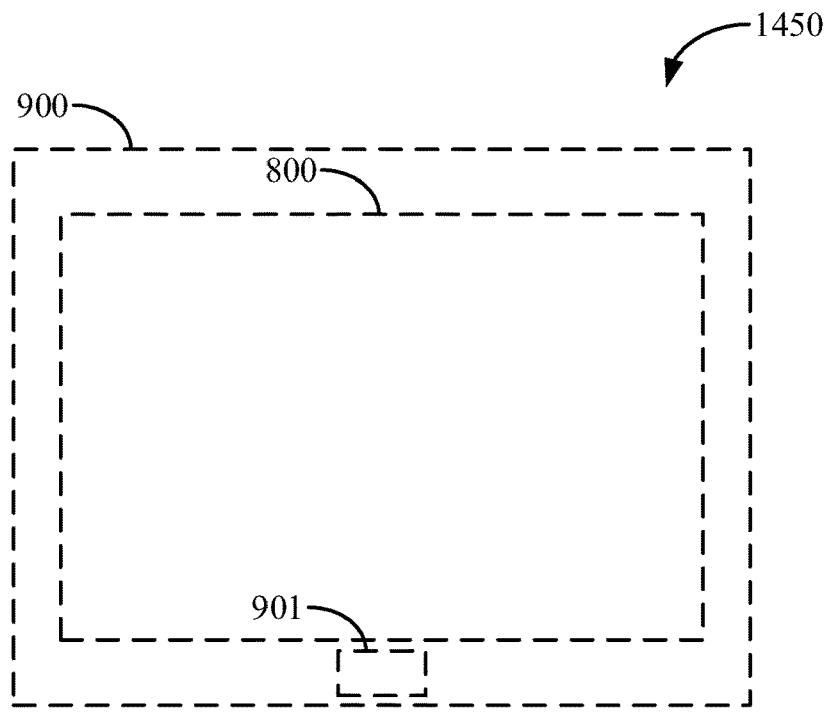
FIG. 14 shows a schematic structural diagram of a display device according to an embodiment of the present disclosure.

Further, and as will be described below with reference to FIG. 14, a display device including the display back panel is provided by an embodiment of the present disclosure. Referring now to FIG. 14, a schematic structure diagram 1450 depicts a display device 900 including the display back panel 800. The display device 1450 may further include a control circuit board 901.

It will be appreciated that a specific type of the display device 900, such as a display screen, a television, a mobile phone, a tablet computer, a smart watch, etc., should not be considered limited by the present disclosure, and that those skilled in the art may select a given display device according to actual use requirements the selected display device. As such, further details are not provided herein. It will further be appreciated that, in addition to the display back panel 800 and the control circuit board 901, the display device 900 may include other components and structures conferring useful functionality to the display device 900, such as an OLED display screen, a power cord, etc., and that those skilled in the art may supplement such components and structures according to a function of a given display device. As such, further details are not provided herein.

In summary, an embodiment of the present disclosure provides a display device which may exhibit a higher external quantum effect of the display back panel included therein. Further, the light-emitting rate of the display device may be better, such that the display device may have lower energy consumption and a better display effect as compared to a conventional OLED device. Further those skilled in the art will appreciate that the features and advantages described hereinabove for the display back panel may be applicable to the display device, details of which are not provided herein again.

In this way, a display back panel is provided, which may include a patterned second electrode, such as a cathode, on a surface of a light-emitting layer and confined in a reflective cup-shaped structure. The technical effect of such a configuration is that a first electrode, such as an anode, may reflect waveguide light laterally propagated by the light-emitting layer, whereby the waveguide light may freely pass from the display back panel, thus improving a light-emitting efficiency of the light-emitting layer. Further, since the reflected waveguide light does not need to pass through the second electrode, an external quantum effect of the light-emitting layer may be enhanced.

In one example, a display back panel, comprising a substrate, an insulating layer disposed on one side of the substrate, the insulating layer comprising a plurality of recesses, the plurality of recesses comprising a bottom surface and an inclined portion, a first electrode disposed on a surface of the insulating layer facing away from the substrate, a pixel defining layer disposed on a surface of the first electrode facing away from the substrate, the pixel defining layer comprising a plurality of openings, where an orthographic projection of the plurality of openings on the substrate overlaps an orthographic projection of the bottom surface of the plurality of recesses on the substrate, a light-emitting layer disposed in the plurality of openings and covering at least a portion of the first electrode, and a second electrode disposed on a surface of the light-emitting layer facing away from the substrate, where an orthographic projection of the second electrode on the first electrode overlaps an orthographic projection of the plurality of openings on the first electrode.

Optionally, the display back panel, wherein the first electrode is an anode and is composed of a reflective material, and the second electrode is a cathode and is composed of a light transmissive material.

Optionally, the display back panel, wherein the orthographic projection of the second electrode on the first electrode overlaps an orthographic projection of the light-emitting layer on the first electrode.

Optionally, the display back panel, wherein an orthographic projection of the second electrode and the pixel defining layer on the substrate completely covers the substrate.

Optionally, a display device, comprising the display back panel, and a control circuit board.

In another example, a method of manufacturing a display back panel, comprising sequentially forming an insulating layer, a first electrode, and a pixel defining layer on one side of a substrate, where the insulating layer has a plurality of recesses, the plurality of recesses comprising a bottom surface and an inclined portion, the pixel defining layer comprises a plurality of openings, and an orthographic projection of the plurality of openings on the substrate overlaps an orthographic projection of the bottom surface of the plurality of recesses on the substrate, forming a photoresist layer on a surface of the pixel defining layer facing away from the substrate, where an orthographic projection of a hollow portion of a pattern of the photoresist layer on the first electrode overlaps an orthographic projection of the plurality of openings on the first electrode, and forming a light-emitting layer and a second electrode, including forming a light-emitting material layer on a surface of the photoresist layer and the first electrode, forming the light-emitting layer by peeling off the photoresist layer, and forming the second electrode on a surface of the light-emitting layer facing away from the substrate, where an orthographic projection of the second electrode on the first electrode overlaps an orthographic projection of the plurality of openings on the first electrode.

Optionally, the method, wherein forming the second electrode further includes forming the second electrode by vapor deposition of a high-precision mask.

Optionally, the method, wherein forming the light-emitting layer and the second electrode further includes forming a second electrode material layer on a surface of the light-emitting material layer, and forming the second electrode further includes forming the second electrode by peeling off the photoresist layer, where the light-emitting layer and the second electrode have a same pattern.

Optionally, the method, wherein the photoresist layer is formed of a negative photoresist, and a longitudinal section of the photoresist layer is in a shape of an inverted trapezoid.

Optionally, the method, wherein an orthographic projection of the photoresist layer on the substrate overlaps an orthographic projection of the pixel defining layer on the substrate.

It will be appreciated that the various embodiments of the present disclosure are described in a progressive manner, wherein each embodiment focuses on differences from other embodiments, and similar parts between the various embodiments may be referred to each other.

It will be appreciated that ordinal terms such as "first" and "second" are used merely to distinguish one entity or operation from another entity or operation, and do not necessarily require or imply any such actual relationship or order between these entities or operations.

FIGS. 1-3, 5-7, 10-12, and 14 show example configurations with relative positioning of the various components described herein. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space there-between and no other components may be referred to as such, in at least one example. As yet another example, elements shown above/below one another, at opposite sides to one another, or to the left/right of one another may be referred to as such, relative to one another.

Further, as shown in the figures, a topmost element or point of element may be referred to as a "top" of the component and a bottommost element or point of the element may be referred to as a "bottom" of the component, in at least one example. As used herein, top/bottom, upper/lower, above/ below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

It is to be understood that the above embodiments are merely exemplary embodiments employed to explain the principles of the inventive concepts, but the inventive concepts are not limited thereto. Various modifications and improvements can be made by those skilled in the art without departing from the spirit and scope of the disclosure, and such modifications and improvements are also considered to be within the scope of the disclosure.

The invention claimed is:

1. A method of forming a display back panel, comprising:
    forming a substrate;
    forming an insulating layer disposed on one side of the substrate, the insulating layer comprising a plurality of recesses, the plurality of recesses comprising a bottom surface and an inclined portion;
    forming a first electrode disposed on a surface of the insulating layer facing away from the substrate;
    forming a pixel defining layer disposed on a surface of the first electrode facing away from the substrate, the pixel defining layer comprising a plurality of openings, where an orthographic projection of the plurality of openings on the substrate overlaps an orthographic projection of the bottom surface of the plurality of recesses on the substrate;
    forming a first photoresist layer on a surface of the pixel defining layer facing away from the substrate, where an orthographic projection of a hollow portion of a pattern of the first photoresist layer on the first electrode overlaps an orthographic projection of the plurality of openings on the first electrode;
    forming a light-emitting layer on the first photo resist layer and peeling the first photoresist layer, the light emitting layer disposed in the plurality of openings and covering at least a portion of the first electrode; and
    forming a second electrode disposed on a surface of the light-emitting layer facing away from the substrate, where an orthographic projection of the second electrode on the first electrode overlaps an orthographic projection of the plurality of openings on the first electrode.

2. The method of claim 1, wherein
    the first electrode is an anode and is composed of a reflective material; and
    the second electrode is a cathode and is composed of a light transmissive material.

3. The method of claim 2, wherein
    the reflective material is a magnesium silver alloy; and
    the light transmissive material is a silver/indium tin oxide.

4. The method of claim 1, wherein the orthographic projection of the second electrode on the first electrode overlaps an orthographic projection of the light-emitting layer on the first electrode.

5. The method of claim 1, wherein an orthographic projection of the second electrode and the pixel defining layer on the substrate completely covers the substrate.

6. The method of claim 1, wherein
    the insulating layer includes a first insulating sublayer and a second insulating sublayer in a stacked configuration;
    an upper surface of the first insulating sublayer forms the bottom surface of the plurality of recesses; and
    sides of the second insulating sublayer form the inclined portion of the plurality of recesses.

7. The method of claim 1, wherein the pixel defining layer is composed of a light transmissive organic material.

8. The method of claim 7, wherein the light transmissive organic material is polyethyl methacrylate or polyurethane.

9. The method of claim 1, wherein each of the second electrode and the light-emitting layer have a same pattern.

10. A method of manufacturing a display back panel, comprising:
    sequentially forming an insulating layer, a first electrode, and a pixel defining layer on one side of a substrate, where
        the insulating layer has a plurality of recesses, the plurality of recesses comprising a bottom surface and an inclined portion,
        the pixel defining layer comprises a plurality of openings, and
        an orthographic projection of the plurality of openings on the substrate overlaps an orthographic projection of the bottom surface of the plurality of recesses on the substrate;
    forming a first photoresist layer on a surface of the pixel defining layer facing away from the substrate, where an orthographic projection of a hollow portion of a pattern of the first photoresist layer on the first electrode overlaps an orthographic projection of the plurality of openings on the first electrode; and
    forming a light-emitting layer and a second electrode, including:
        forming a light-emitting material layer on a surface of the first photoresist layer and the first electrode;
        forming the light-emitting layer by peeling off the first photoresist layer; and
        forming the second electrode on a surface of the light-emitting layer facing away from the substrate, where an orthographic projection of the second electrode on the first electrode overlaps an orthographic projection of the plurality of openings on the first electrode.

11. The method of claim 10, wherein forming the second electrode further includes:
forming the second electrode by vapor deposition of a high-precision mask.

12. The method of claim 10, wherein
forming the light-emitting layer and the second electrode further includes:
forming a second electrode material layer on a surface of the light-emitting material layer; and
forming the second electrode further includes:
forming the second electrode by peeling off the first photoresist layer, where the light-emitting layer and the second electrode have a same pattern.

13. The method of claim 12, wherein
the first photoresist layer is formed of a negative photoresist; and
a longitudinal section of the first photoresist layer is in a shape of an inverted trapezoid.

14. The method of claim 13, wherein an orthographic projection of the first photoresist layer on the substrate overlaps an orthographic projection of the pixel defining layer on the substrate.

15. The method of claim 10, wherein forming the insulating layer includes:
sequentially forming a first insulating sublayer and a second insulating sublayer on the one side of the substrate.

16. The method of claim 15, wherein forming the insulating layer further includes:
forming a second photoresist layer on a surface of the second insulating sublayer facing away from the substrate; and
peeling off the second photoresist layer to form the insulating layer.

17. The method of claim 10, wherein forming the first electrode includes:
forming the first electrode by vapor deposition.

18. The method of claim 10, wherein forming the pixel definition layer includes:
forming the pixel definition layer by vapor deposition.

19. A method of forming a display device, comprising:
forming a substrate;
forming an insulating layer disposed on one side of the substrate and comprising a plurality of recesses, the plurality of recesses comprising a bottom surface and an inclined portion;
forming a first electrode disposed on a surface of the insulating layer facing away from the substrate;
forming a pixel defining layer disposed on a surface of the first electrode facing away from the substrate and comprising a plurality of openings, where an orthographic projection of the plurality of openings on the substrate overlaps an orthographic projection of the bottom surface of the plurality of recesses on the substrate;
forming a first photoresist layer on a surface of the pixel defining layer facing away from the substrate, where an orthographic projection of a hollow portion of a pattern of the first photoresist layer on the first electrode overlaps an orthographic projection of the plurality of openings on the first electrode;
forming a light-emitting layer on the first photoresist layer and peeling the first photoresist layer, the light emitting layer disposed in the plurality of openings and covering at least a portion of the first electrode; and
forming a second electrode disposed on a surface of the light-emitting layer facing away from the substrate, where an orthographic projection of the second electrode on the first electrode overlaps an orthographic projection of the plurality of openings on the first electrode; and
wherein the display device comprises a control circuit board.

20. The method of claim 19, wherein the display device comprises:
an organic light-emitting diode display screen; and
a power cord.

* * * * *